United States Patent [19]
Liaw

[11] Patent Number: 5,843,815
[45] Date of Patent: Dec. 1, 1998

[54] METHOD FOR FABRICATING A MOSFET DEVICE, FOR AN SRAM CELL, USING A SELF-ALIGNED ION IMPLANTED HALO REGION

[75] Inventor: Jhon-Jhy Liaw, Sang Chorng, Taiwan

[73] Assignee: Taiwan Semiconductor Manufacturing Company, Ltd., Hsin-Chu, Taiwan

[21] Appl. No.: 783,984

[22] Filed: Jan. 15, 1997

[51] Int. Cl.[6] .................................................. H01L 21/8244
[52] U.S. Cl. ........................................ 438/238; 438/647
[58] Field of Search .................................. 438/238, 382, 438/384, 385, 592, 647, 649, 655, 657

[56] References Cited

U.S. PATENT DOCUMENTS

| | | | |
|---|---|---|---|
| 4,902,640 | 2/1990 | Sachitano et al. | 437/57 |
| 5,480,837 | 1/1996 | Liaw et al. | 438/647 |
| 5,521,113 | 5/1996 | Hsue et al. | 438/238 |
| 5,652,174 | 7/1997 | Wuu et al. | 438/238 |
| 5,654,240 | 8/1997 | Lee et al. | 438/647 |

*Primary Examiner*—Chandra Chaudhari
*Attorney, Agent, or Firm*—George O. Saile; Stephen B. Ackerman

[57] ABSTRACT

A process for fabricating a MOSFET device, for a triple polysilicon SRAM process, using a self-aligned, halo implant, (SAC halo implant), region, used to improve MOSFET performance and yield, has been developed. This process features implanting the SAC halo region, into a region of the semiconductor substrate, already exposed and prepared for a self-aligned contact, (SAC), structure, therefore requiring no additional photolithographic procedures.

32 Claims, 4 Drawing Sheets

METHOD FOR FABRICATING A MOSFET DEVICE, FOR AN SRAM CELL, USING A SELF-ALIGNED ION IMPLANTED HALO REGION

BACKGROUND OF THE INVENTION

(1) Field of the Invention

The present invention relates to a process used to fabricate metal oxide semiconductor field effect transistors, (MOSFET), devices, used for static random access memory, (SRAM), cells, and more specifically to a process used to improve the performance of, and simplify the process of, the MOSFET device, by using a self-aligned, halo implant region.

(2) Description of Prior Art

Static random access memory, (SRAM), cells, are now being fabricating using high speed, high density, complimentary metal oxide semiconductor, (CMOS), devices. Conventional SRAM cells are usually configured using either four n-channel, and two p-channel, MOSFET devices, or using four n-channel, and two resistor load devices. The four n-channel, and two resistor load SRAM configuration, consumes less area then counterparts using both n-channel and p-channel devices, and thus has been used extensively. A triple polysilicon process has been used to fabricate devices used for the SRAM cell, comprised of n-channel and resistor load devices. In this process one polysilicon layer is used for the gate structure of the CMOS device, while another polysilicon layer is used for the load resistors. A third polysilicon layer is used as part of a polycide, (metal silicide - polysilicon), composite structure, providing contact to source and drain regions of an underlying n-channel device. To further decrease the area needed to create this type of SRAM cell device, (n-channel and resistor loads), a self aligned contact, (SAC), concept has been developed. The SAC procedure allows an easier photolithographic procedure to be used to expose a source and drain region. For example, using a conventional process, or a process not using the SAC concept, in order to insure alignment to the underlying source and drain region, during the photolithographic procedure, additional area has to be made available, to insure that the entire opening of the contact hole resides over the source and drain region. This results in an increase in the SRAM cell size, and thus reduces SRAM density. However with the use of the SAC procedure, a source and drain region is exposed, however the opening to this region is enlarged to overlie portions of adjacent insulator coated, polysilicon gate structures, with the source and drain region residing between polysilicon gate structures. Therefore the area needed for contact is defined by the space between polysilicon gate structures, and not dependent on photolithographic alignment procedures.

This invention will describe a process for fabricating MOSFET devices, for SRAM cells, using the SAC procedure. However this invention will also expand the use of the SAC procedure, to include an ion implantation step, into the SAC exposed region, with the implanted region being used to restrict the source and drain to substrate depletion region, thus reducing MOSFET punchthrough leakage. Conventional processes sometimes place this implant, possessing the same dopant type, but a higher concentration then found in the substrate, into the entire underlying region that will be used for the subsequent MOSFET device. Therefore the parasitic junction capacitance encountered with the conventional process will be larger then a parasitic junction capacitance resulting from the placing the depletion region restricting implant only in the source and drain region, of the MOSFET device. This invention using a SAC halo implantation process, needs no additional mask, and does place the depletion region restricting implant, referred to as halo implant, only in the source and drain area, thus minimizing the increase in parasitic junction capacitance. Prior art such as Sachitano, et al, in U.S. Pat. No. 4,902,640, disclose a high speed CMOS, SRAM process, however they do not describe the novel process for placing a halo implant region in a SAC opening.

SUMMARY OF THE INVENTION

It is an object of this invention to fabricate MOSFET devices for an SRAM cell, using a self aligned contact, (SAC), process, allowing polysilicon to contact an underlying source and drain region.

It is another object of this invention to use a triple polysilicon layer process for fabrication of the MOSFET device, of the SRAM cell, using a first polysilicon layer for part of the gate structure, a second polysilicon layer for part of the SAC structure, and the third polysilicon layer for the load resistor.

It is still another object of this invention to use the SAC opening, in an insulator layer, to an underlying source and drain region, to form an ion implanted region, used to restrict the depletion region formed between the source and drain to substrate, thus reducing punchthrough leakage.

In accordance with the present invention a process is described for fabricating a MOSFET device, for an SRAM cell, using a SAC process for polycide contact to underlying silicon regions, and also using an ion implanted region, self-aligned to a source and drain region, formed via ion implantation, using the SAC opening as a mask, and used to restrict the depletion region formed between source and drain to substrate. After formation of polycide gate structures, on thin gate oxides, and with the polycide gate structure capped with an insulator layer, lightly doped source and drain regions are formed, in areas not covered by the insulator capped, polycide gate structures. After formation of insulator spacers, on the sides of the polycide gate structures, heavily doped source and drain regions are formed in the space between polycide gate structures. A insulator layer is deposited and patterned to produce a self-aligned contact, (SAC), opening, exposing a heavily doped source and drain region in the space between insulator capped, polycide gate structures. An ion implantation is performed, to increase the level of doping in the substrate, only in the region where the substrate is exposed in the SAC opening. This self-aligned halo implant, (SAC halo implant), restricts the depletion region formed between source and drain to substrate. Depositions of an underlying polysilicon layer, and an overlying metal silicide layer, are followed by patterning of the metal silicide and polysilicon layers to create a polycide SAC structure, in the SAC opening, partially overlying the insulator capped, polycide gate structures. Another deposition of polysilicon is followed by patterning of this polysilicon layer, creating polysilicon load resistors. Deposition of a composite interlevel dielectric layer is followed by an anneal, used to reflow the composite interlevel dielectric layer. Subsequent processing includes opening contact holes, in the composite interlevel dielectric layer, exposing the underlying polycide SAC structure, and the underlying polysilicon load resistors, followed by the formation of metal interconnect structures, contacting the underlying polycide SAC structure and the polysilicon load resistors.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of fabricating MOSFET devices, used for an SRAM cell, using a SAC process which features the use of a self-aligned halo ion implantation region, will now be described in detail. The SRAM cell, to which this invention will be applied to, will be an SRAM cell comprised of n-channel, MOSFET devices, and load resistors. This invention can also be applied to SRAM cells comprised of n-channel, MOSFET devices, and p-channel, MOSFET devices. This process will then use polysilicon load resistors, in place of the p-channel, MOSFET devices.

Figure 1:
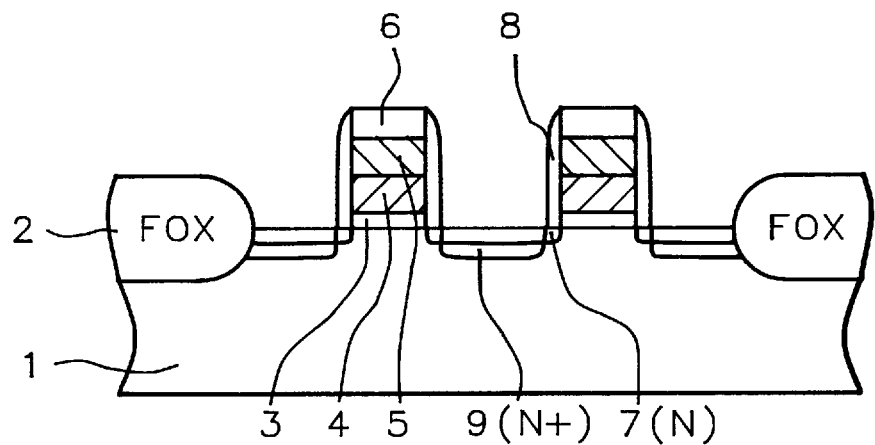
FIGS. 1–7, which schematically, in cross-sectional style, present key stages of fabrication of the MOSFET devices, used for creation of an SRAM cell, incorporating the SAC process, and the key, self-aligned halo ion implantation procedure, used to reduce or restrict the depletion region formed between source and drain to substrate.

A P type, single crystalline, silicon substrate, 1, with a <100> crystallographic orientation, is used, and shown schematically in FIG. 1. Field oxide, (FOX), regions, 2, formed for isolation purposes, are thermally grown to a thickness between about 3000 to 5000 Angstroms, using thermal oxidation procedures. Subsequent device regions are protected from the FOX oxidation procedure by oxidation resistant masking patterns, comprised of a silicon nitride - silicon oxide composite masking layer. After removal of the composite, oxidation resistant mask, a thin gate, silicon dioxide layer, 3, is thermally grown, in an oxygen steam ambient, at a temperature between about 800° to 1000° C., to a thickness between about 50 to 250 Angstroms. Next a first layer of in situ doped polysilicon, 4, is deposited using low pressure chemical vapor deposition, (LPCVD), procedures, at a temperature between about 500° to 700° C., to a thickness between about 500 to 2000 Angstroms, using silane as a source, and with the addition of phosphine to provide the needed dopant. A first layer of tungsten silicide, 5, is then deposited, using LPCVD procedures, at a temperature between about 400° to 600° C., to a thickness between about 750 to 2000 Angstroms, using tungsten hexafluoride and silane as a source. Finally a first silicon oxide layer, 6, is deposited using either LPCVD or plasma enhanced chemical vapor deposition, (PECVD), procedures, at a temperature between about 350° to 750° C., to a thickness between about 1000 to 3000 Angstroms, using tetraethylorthosilicate, (TEOS), as a source.

Conventional photolithographic and reactive ion etching, (RIE), procedures, using $CHF_3$ as an etchant for first silicon oxide layer, 6, and $Cl_2$ as an etchant for both first tungsten silicide layer, 5, and first polysilicon layer, 4, are used to produce the silicon oxide capped, polycide gate, (first tungsten silicide - first polysilicon), structures, shown schematically in FIG. 1. After photoresist removal via plasma oxygen ashing and careful wet cleans, a lightly doped source and drain region, 7, is next created via ion implantation of phosphorous or arsenic, at an energy between about 25 to 75 KeV, at a dose between about 5E11 to 5E13 atoms/$cm^2$. A second silicon oxide layer is deposited, again via use of either LPCVD or PECVD procedures, at a temperature between about 350° to 750° C., to a thickness between about 1500 to 4000 Angstroms, using TEOS as a source, followed, by an anisotropic RIE procedure, using $CHF_3$ as an etchant, to create insulator spacers, 8, schematically shown in FIG. 1. The space between polycide gate spacers, to be used as part of the surface area for contact the subsequent SAC structure is between about 0.3 by 0.5 uM. Heavily doped source and drain regions, 9, are then produced via ion implantation of either arsenic or phosphorous, at an energy between about 30 to 100 KeV, at a dose between about 1E14 to 1E16 atoms/$cm^2$. This region is also shown schematically in FIG. 1.

Figure 2:
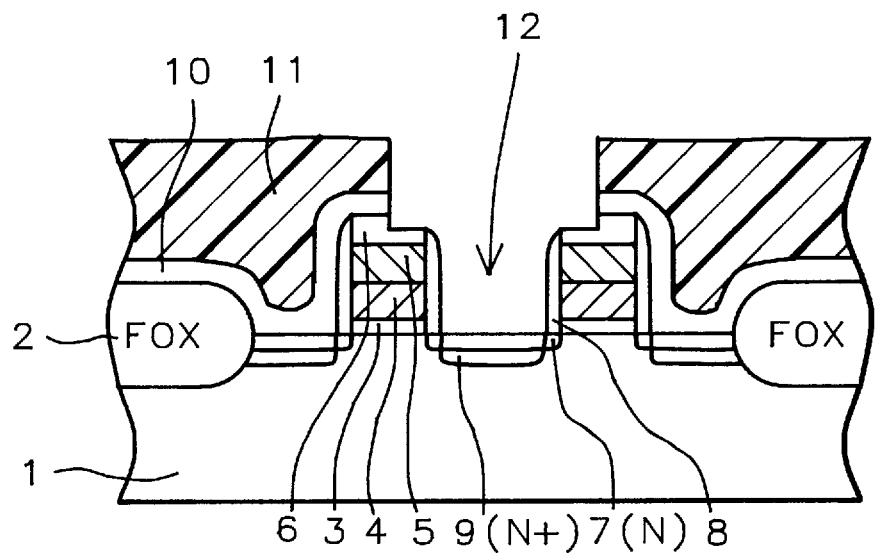

A third layer of silicon oxide, 10, is deposited, again using either LPCVD or PECVD procedures, at a temperature between about 350° to 750° C., to a thickness between about 1000 to 2000 Angstroms, using TEOS as a source. A first photoresist shape, 11, is formed, allowing a self-aligned contact, (SAC), opening, 12, with the opening having a dimension of about 0.4 by 0.6 uM, to be created by RIE of third silicon oxide layer, 10, using $CHF_3$ as an etchant. SAC opening, 12, schematically shown in FIG. 2, exposes a heavily source and drain region, 9, in the space between polycide gate structures. The design of SAC opening, 12, also results in the removal of third silicon oxide layer, 10, and of a portion of the capping, first silicon oxide layer, 6, from the top surface of the polycide gate structures, in a region where the polycide gate structures border the space between polycide gate structures.

Figure 3:
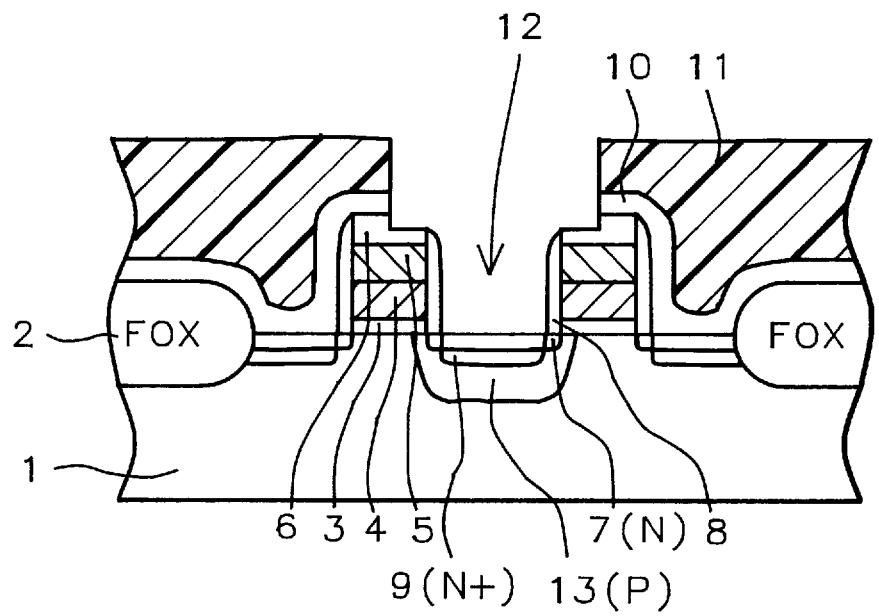

At this stage of the process, a P type region, 13, is ion implanted into the space between polycide gate structures, at an energy high enough to enable P type region, 13, to completely envelop heavily doped source and drain region, 9. This is schematically shown in FIG. 3. This ion implantation process, using $B^{11}$, at an energy between about 60 to 180 KeV, at a dose between about 1E12 to 2E13 atoms/$cm^2$, is self-aligned to the source and drain region, 9. The envelopment of the heavily doped source and drain region, 9, by the P type region, 13, is referred to as a self-aligned, halo implant, (SAC halo implant). The P dopant level of the SAC halo implant region, is greater then the P dopant level of semiconductor substrate, 1, therefore restricting the source and drain to substrate, depletion region, to a greater extent then would have been achieved for counterparts fabricated without a SAC halo implant region. The restricted depletion region reduces leakage between encroaching depletion regions, and thus reduces possible yield detractors. In addition the SAC halo region only places the higher P type concentration, in the region that it is needed, specifically around the heavily doped source and drain region, 9. Another alternative would be to place a P type region, or P type tub, higher in P type dopant level then substrate, 1, in a region of substrate, 1, encompassing the entire MOSFET device. This process is referred to as a cell implant, requiring an additional mask, as compared to the SAC halo process, which uses the SAC opening, 12, as a mask. In addition the larger area used by the cell, or tub implant, results in a larger parasitic junction capacitance, than resulting with counterparts fabricated with the SAC halo implant region, thus adversely influencing SRAM performance.

Figure 4:
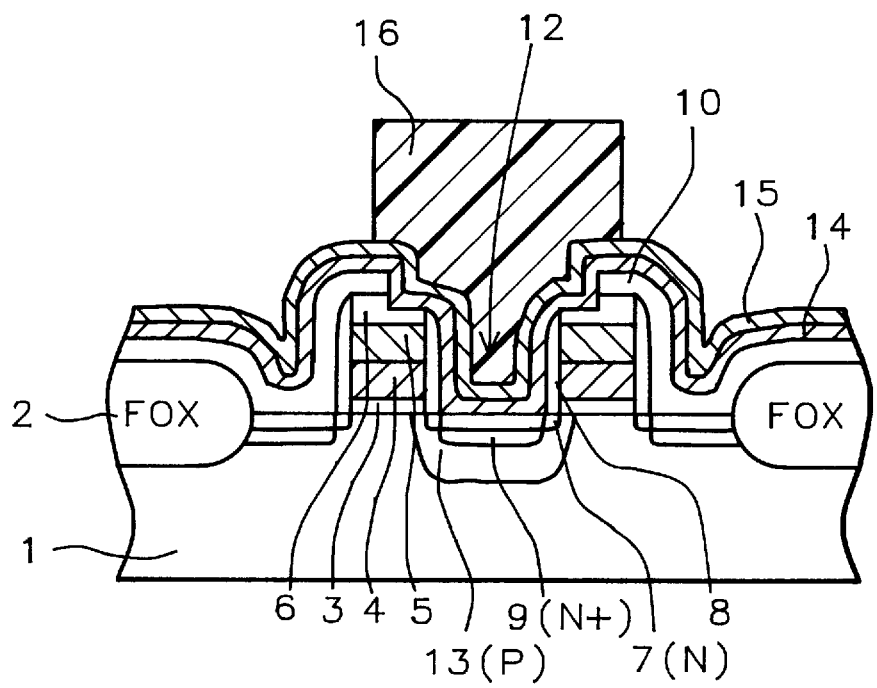

After removal of first photoresist shape, 11, via plasma oxygen ashing and careful wet cleans, a second layer of polysilicon, 14, is deposited using LPCVD procedures, at a temperature between about 500° to 700° C., to a thickness between about 450 to 650 Angstroms, including the addition of phosphine or arsine to a silane ambient, for purposes of in situ doping. A second layer of tungsten silicide, 15, is next deposited using LPCVD procedures, at a temperature between about 400° to 600° C., to a thickness between about 750 to 2000 Angstroms, using tungsten hexafluoride and silane as a source. Photoresist shape, 16, is formed to serve as an etch mask for second tungsten silicide layer, 15, and second polysilicon layer, 14. This is schematically shown in FIG. 4.

Figure 5:
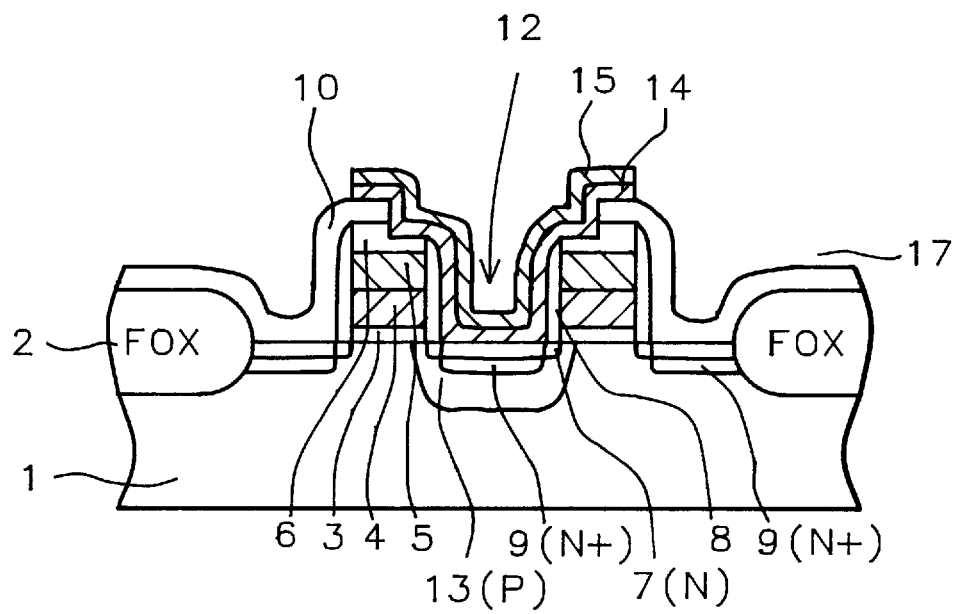
Figure 6:
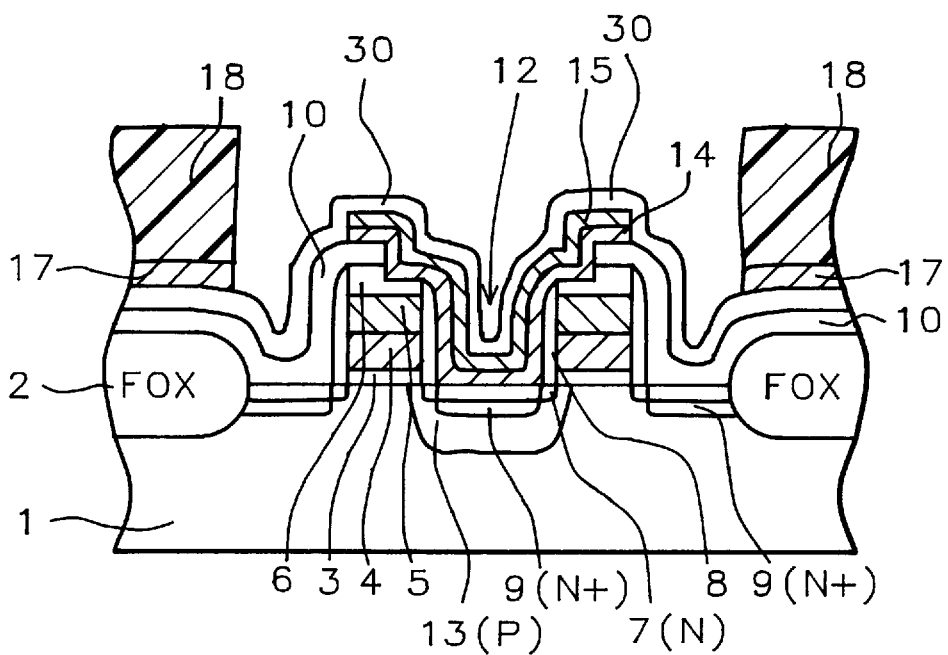

A RIE etching procedure, using $Cl_2$ as an etchant, is employed to create a polycide SAC structure, comprised of an overlying tungsten silicide layer, 15, and an underlying second polysilicon layer, 14, shown schematically in FIG. 5, using photoresist shape, 16, as a mask. After removal of photoresist shape, 16, via plasma ashing and wet clean procedures, a silicon oxide layer, 30, at a thickness between about 1000 to 2000 Angstroms, is deposited, using TEOS as a source. A third layer of polysilicon is next deposited, using LPCVD procedures, at a temperature between about 500° to 700° C., to a thickness between about 450 to 650 Angstroms. Another photoresist shape, 18, is created and used as a mask to define polysilicon load resistors, 17, shown schematically in FIG. 6. A RIE procedure using $Cl_2$ as an etchant, is used to create polysilicon load resistors, 17, again shown schematically in FIG. 6.

Figure 7:
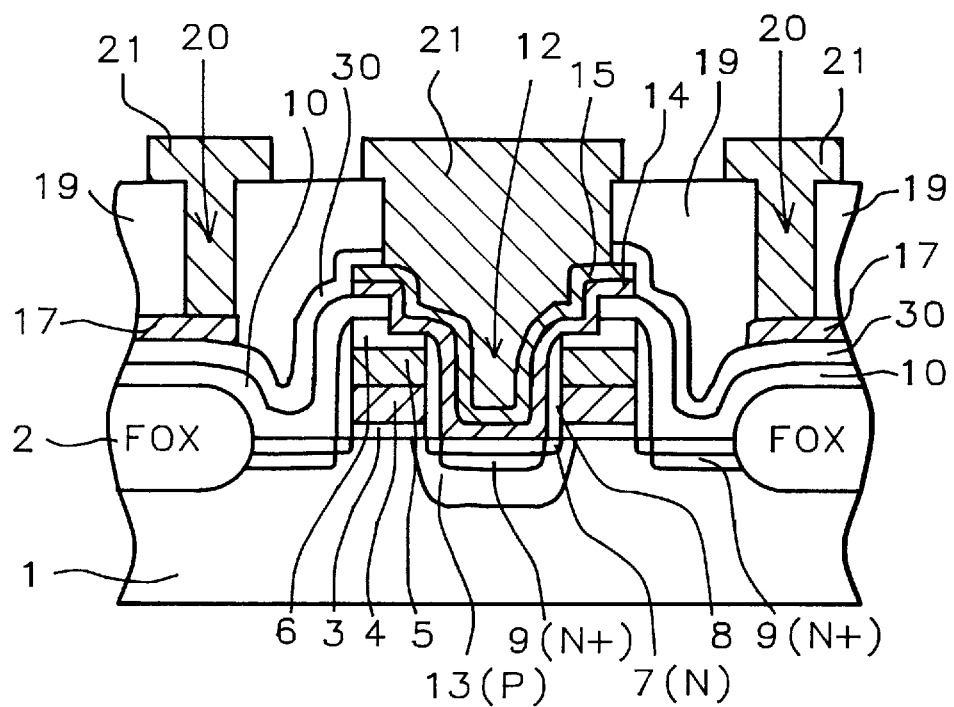

After removal of photoresist shapes, 18, again using plasma oxygen ashing and careful wet cleans, a composite interlevel dielectric layer, 19, is deposited. The composite interlevel dielectric layer, 19, is comprised of an underlying PECVD deposited, TEOS oxide layer, deposited at a temperature between about 300° to 500° C., to a thickness between about 1000 to 2000 Angstroms, and an overlying PECVD deposited, boron-phosphorous doped, TEOS, (BPTEOS), oxide layer, deposited at a temperature between about 400° to 700° C., to a thickness between about 3000 to 12000 Angstroms. A temperature cycle between about 750° to 900° C. is then used to allow the overlying BPTEOS to reflow, resulting in a smooth topology of the composite interlevel dielectric layer, shown schematically in FIG. 7.

Contact hole openings, 20, are next created in interlevel dielectric layer, 19, and silicon oxide layer, 30, via conventional photolithographic and RIE procedures, using $CHF_3$ as an etchant, exposing the top surface of polysilicon load resistors, 17, and of the polycide SAC structure. After photoresist removal, via plasma oxygen ashing and careful wet cleans, a deposition of aluminum, containing between about 1 to 3% copper, is performed, using r.f. sputtering procedures, to a thickness between about 3000 to 6000 Angstroms. Conventional photolithographic and RIE procedures, using $Cl_2$ as an etchant, are used to create interconnect metal structures, 21, schematically shown in FIG. 7. Photoresist removal is once again accomplished via plasma oxygen ashing, and careful wet cleans.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a MOSFET device, for a SRAM cell, on a semiconductor substrate, using a self-aligned, halo, (SAC halo), implant region, in said MOSFET device, comprising the steps of:

forming field oxide regions in said semiconductor substrate;

growing a gate insulator layer on said semiconductor substrate, in areas not covered by said field oxide regions;

depositing a first polysilicon layer on said gate insulator layer;

depositing a first metal silicide layer on said first polysilicon layer;

depositing a first insulator layer on said first metal silicide layer;

patterning of said first insulator layer, of said first metal silicide layer, and of said first polysilicon layer, to form polycide gate structures, on said gate insulator layer;

ion implanting a first conductivity imparting dopant into said semiconductor substrate, in regions not covered by said polycide gate structures, to form a lightly doped source and drain region;

depositing a second insulator layer;

anisotropic etching of said second insulator layer to form insulator spacers on the sides of said polycide gate structures;

ion implanting a second conductivity imparting dopant into said semiconductor substrate, in regions not covered by said polycide gate structures, or not covered by said insulator spacers, to form a heavily doped source and drain region;

depositing a third insulator layer;

opening a hole in said third insulator layer, creating a self-aligned contact, (SAC), opening, exposing said heavily doped source and drain region, in said semiconductor substrate, in the space between said polycide gate structures, with said insulator spacers;

ion implanting a third conductivity imparting dopant into said SAC opening, to create said SAC halo implant region, in said semiconductor substrate, in space between said polycide gate structures;

depositing a second polysilicon layer, including deposition on said heavily doped source and drain region, and on said SAC halo implant region, in said SAC opening, in space between said polycide gate structures;

depositing a second metal silicide layer on said second polysilicon layer;

patterning of said second metal silicide layer, and of said second polysilicon layer, to create a polycide, self-aligned contact, (SAC), structure, completely overlying said SAC opening, and with said polycide SAC structure partially overlying a portion of said polysilicon gate structures, in regions where said polycide gate structures are adjacent to said SAC opening;

depositing a fourth insulator layer;

depositing a third polysilicon layer;

patterning of said third polysilicon layer to create polysilicon load resistors;

depositing a composite interlevel dielectric layer on said semiconductor substrate, including deposition on said polycide SAC structure, and on said polysilicon load resistors;

annealing of said composite interlevel dielectric layer;

opening contact holes in said composite interlevel dielectric layer, and in said fourth insulator layer, to expose top surface of said polycide SAC structure, and top surface of said polysilicon load resistors; and forming an interconnect metallization structures, overlying and contacting, said polycide SAC structure, and said polysilicon load resistors, in said contact holes, in said composite interlevel dielectric layer.

2. The method of claim 1, wherein said first polysilicon layer, of said polycide gate structure, is deposited using LPCVD procedures, at a temperature between about 500° to 700° C., to a thickness between about 500 to 2000 Angstroms, using silane as a source, and with the addition of phosphine to provide, to provide in situ doping.

3. The method of claim 1, wherein said first metal silicide layer, of said polycide gate structure, is tungsten silicide, deposited using LPCVD procedures, at a temperature between about 400° to 600° C., to a thickness between about 750 to 2000 Angstroms, using silane and tungsten hexafluoride as a source.

4. The method of claim 1, wherein said polycide gate structures are formed via anisotropic, RIE, using $CHF_3$ as an etchant for said first insulator layer, and using $Cl_2$ as an etchant for said first metal silicide layer, and for said first polysilicon layer.

5. The method of claim 1, wherein said insulator spacers, formed on sides of said polycide gate structures, are comprised of silicon oxide, deposited using LPCVD or PECVD procedures, using TEOS as a source, to a thickness between about 1500 to 4000 Angstroms, and etched via anisotropic RIE procedures, using $CHF_3$ as an etchant.

6. The method of claim 1, wherein the space, in said semiconductor substrate, between said polycide gate structures, with said insulator spacers on sides of said polycide gate structures, is between about 0.3 by 0.5 uM.

7. The method of claim 1, wherein said second imparting conductivity dopant, used to form said heavily doped source and drain regions, in exposed region of said semiconductor substrate, between said polycide gate structures, is arsenic or phosphorous, ion implanted at an energy between about 30 to 100 KeV, at a dose between about 1E14 to 1E16 atoms/$cm^2$.

8. The method of claim 1, wherein said SAC opening, in said third insulator layer, exposing said heavily doped source and drain regions, between said polycide gate structures, is formed via anisotropic RIE procedures, using $CHF_3$ as an etchant, with said SAC opening having a dimension of about 0.4 by 0.6 uM.

9. The method of claim 1, wherein said third conductivity imparting dopant, used to create said SAC halo implant region, is $B^{11}$, ion implanted at an energy between about 60 to 180 KeV, at a dose between about 1E12 to 2E13 atoms/$cm^2$.

10. The method of claim 1, wherein said second polysilicon layer is deposited using LPCVD procedures, at a temperature between about 500° to 700° C., to a thickness between about 450 to 650 Angstroms, using silane as a source, and using phosphine to provide the in situ doping.

11. The method of claim 1, wherein said second metal silicide layer is tungsten silicide, deposited using LPCVD procedures, at a temperature between about 400° to 600° C., to a thickness between about 750 to 2000 Angstroms, using tungsten hexafluoride and silane as a source.

12. The method of claim 1, wherein said polycide SAC structure is formed via anisotropic RIE procedures, using $Cl_2$ as an etchant for said second metal silicide layer, and for said second polysilicon layer.

13. The method of claim 1, wherein said third polysilicon layer is deposited using LPCVD procedures, at a temperature between about 500° to 700° C., to a thickness between about 450 to 650 Angstroms.

14. The method of claim 1, wherein anisotropic RIE procedures, using $Cl_2$ as an etchant, are used to pattern said third polysilicon layer, creating said polysilicon load resistors.

15. The method of claim 1, wherein said composite interlevel dielectric layer is comprised of an overlying layer of boron-phosphorous, doped silicon oxide, deposited using PECVD procedures, at a temperature between about 400° to 700° C., to a thickness between about 3000 to 12000 Angstroms, using TEOS as a source, and comprised of an underlying layer of silicon oxide, deposited using PECVD procedures, at a temperature between about 300° to 500° C., to a thickness between about 1000 to 2000 Angstroms, using TEOS as a source.

16. The method of claim 1, wherein said composite interlevel dielectric layer is annealed at a temperature between about 750° to 900° C.

17. A method for forming a self-aligned, halo implant region, (SAC halo region), in a MOSFET device, using a self-aligned contact, (SAC), opening, as a mask, to be used for a triple polysilicon SRAM process, on a semiconductor substrate, comprising the steps of:

growing a gate insulator layer on said semiconductor substrate;

depositing an in situ doped, first polysilicon layer, on said gate insulator layer;

depositing a first tungsten silicide layer, on said first polysilicon layer;

depositing a first silicon oxide layer on said first tungsten silicide layer;

patterning of said first silicon oxide layer, of said first tungsten silicide layer, and of said first polysilicon layer, to from polycide gate structures on underlying, said gate insulator layer;

ion implanting a first conductivity imparting dopant into a region of said semiconductor substrate, not covered by said polycide gate structures, to form a lightly doped source and drain region;

depositing a second silicon oxide layer;

anisotropic etching of said second silicon oxide layer to form silicon oxide spacers on the sides of said polycide gate structures;

ion implanting a second conductivity imparting dopant into a region of said semiconductor substrate, not covered by said polycide gate structures, and not covered by said silicon oxide spacers, to form said heavily doped source and drain region in region between said polycide gate structures;

depositing a third silicon oxide layer;

forming said self-aligned contact, (SAC), opening in said third silicon oxide layer, exposing said heavily doped source and drain region, in region of said semiconductor substrate, between said polycide gate structures and said silicon oxide spacers;

ion implanting a third conductivity imparting dopant into a region of said semiconductor substrate, exposed in said SAC opening, to form a SAC halo implant region;

depositing an in situ doped, second polysilicon layer, on said semiconductor substrate, including deposition on said heavily doped source and drain region, and on said SAC halo implant region, exposed in SAC opening;

depositing a second tungsten silicide layer on said second polysilicon layer;

patterning of said second tungsten silicide layer, and of said second polysilicon layer, to form said polycide SAC structure, completely overlying said heavily doped source and drain region, and said SAC halo implant region, in said SAC opening, and partially overlying a portion of the top of said polycide gate structures, in areas where said polycide gate structures abut said SAC opening;

depositing a fourth silicon oxide layer;

depositing a third polysilicon layer;

patterning of said third polysilicon layer to form polysilicon load resistors;

depositing a composite interlevel dielectric layer, completely covering said polycide SAC structure, and said polysilicon load resistors;

annealing said composite interlevel dielectric layer;

opening contact holes in said composite interlevel dielectric layer, and in said fourth silicon oxide layer, exposing top surface of said polycide SAC structure, and top surface of said polysilicon load resistors; and forming an interconnect metallization structures, overlying and contacting, top surface of said polycide SAC structure, and of said polysilicon load resistors, in said contact holes, in said composite interlevel dielectric layer.

18. The method of claim 17, wherein said first polysilicon layer, of said polycide gate structure, is deposited using LPCVD processing, at a temperature between about 500° to 700° C., to a thickness between about 500 to 1500 Angstroms, using silane as a source, and using phosphine to provide in situ doping.

19. The method of claim 17, wherein said first tungsten silicide layer, of said polycide gate structure, is deposited using LPCVD procedures, at a temperature between about 400° to 600° C., to a thickness between about 750 to 2000 Angstroms, using tungsten hexafluoride and silane as a source.

20. The method of claim 17, wherein said polycide gate structure is formed via anisotropic RIE procedures, using $CHF_3$ as an etchant for said first silicon oxide layer, and using $Cl_2$ as an etchant for said first tungsten silicide layer, and for said first polysilicon layer.

21. The method of claim 17, wherein said silicon oxide spacers, on the sides of said polycide gate structures, are formed by deposition of a second silicon oxide layer, using PECVD or LPCVD procedures, at a temperature between about 300° to 700° C., to a thickness between about 1500 to 4000 angstroms, using TEOS as a source, followed by an anisotropic RIE procedure, using $CHF_3$ as an etchant.

22. The method of claim 17, wherein the space between said polycide gate structures, including said silicon oxide spacers, is between about 0.3 to 0.5 uM.

23. The method of claim 17, wherein said second conductivity imparting dopant, used to create said heavily doped regions, in the space between said polycide gate structures, is arsenic or phosphorous, ion implanted at an energy between about 30 to 100 KeV, at a dose between about 1E14 to 1E16 atoms/$cm^2$.

24. The method of claim 17, wherein said SAC opening is created in said third silicon oxide layer, via anisotropic RIE procedures, using $CHF_3$ as an etchant, with said SAC opening having a dimension of about 0.4 by 0.6 uM.

25. The method of claim 17, wherein said third conductivity imparting dopant, used to create said SAC halo implant, in a region of said semiconductor substrate, exposed in said SAC opening, is $B^{11}$, ion implanted at an energy between about 60 to 180 KeV, at a dose between about 1E12 to 2E13 atoms/$cm^2$.

26. The method of claim 17, wherein said second polysilicon layer, of said polycide SAC structure, is deposited using LPCVD procedures, at a temperature between about 500° to 700° C., to a thickness between about 450 to 650 Angstroms, using silane as a source, and using phosphine to provide the in situ doping.

27. The method of claim 17, wherein said second tungsten silicide layer, of said polycide SAC structure, is deposited using LPCVD procedures, at a temperature between about 400° to 600° C., to a thickness between about 750 to 2000 Angstroms, using tungsten hexafluoride and silane as a source.

28. The method of claim 17, wherein said polycide SAC structure is formed via anisotropic RIE procedures, using $Cl_2$ as an etchant for said second tungsten silicide layer, and for said second polysilicon layer.

29. The method of claim 17, wherein said third polysilicon layer is deposited using LPCVD procedures, at a temperature between about 500° to 700° C., to a thickness between about 450 to 650 Angstroms.

30. The method of claim 17, wherein said third polysilicon layer is patterned to form said polysilicon load resistors, via anisotropic RIE procedures, using $Cl_2$ as an etchant.

31. The method of claim 17, wherein said composite interlevel dielectric layer is comprised of an overlying boron-phosphorous doped, silicon oxide layer, deposited using PECVD procedures, at a temperature between about 500° to 700° C., to a thickness between about 3000 to 12000 Angstroms, using TEOS as a source, and comprised of an underlying layer of silicon oxide, deposited using PECVD procedures, at a temperature between about 300° to 500° C., to a thickness between about 1000 to 2000 Angstroms, using TEOS as a source.

32. The method of claim 17, wherein said composite interlevel dielectric layer is annealed at a temperature between about 750° to 900° C.

* * * * *